US006809827B2

(12) United States Patent
Kreuzer (10) Patent No.: US 6,809,827 B2
(45) Date of Patent: Oct. 26, 2004

(54) SELF REFERENCING MARK INDEPENDENT ALIGNMENT SENSOR

(75) Inventor: Justin L. Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/670,028

(22) Filed: Sep. 25, 2003

(65) Prior Publication Data

US 2004/0066518 A1 Apr. 8, 2004

Related U.S. Application Data

(63) Continuation of application No. 09/553,270, filed on Apr. 20, 2000, now Pat. No. 6,628,406.

(51) Int. Cl.[7] .............................................. G01B 11/02
(52) U.S. Cl. ...................................................... 356/508
(58) Field of Search ................................ 356/508–510, 356/400, 401, 490–492

(56) References Cited

U.S. PATENT DOCUMENTS

| | | |
|---|---|---|
| 3,945,713 A | 3/1976 | Doi et al. |
| 4,340,305 A | 7/1982 | Smith et al. |
| 4,504,148 A | 3/1985 | Kuroki et al. |
| 4,545,683 A | 10/1985 | Markle |
| 4,549,084 A | 10/1985 | Markle |
| 4,578,590 A | 3/1986 | Wu |
| 4,579,453 A | 4/1986 | Makita |
| 4,697,087 A | 9/1987 | Wu |
| 5,559,601 A | 9/1996 | Gallatin et al. |
| 5,767,523 A | 6/1998 | McCullough |
| 6,034,378 A | 3/2000 | Shiraishi |
| 6,100,980 A * | 8/2000 | Ichikawa .................... 356/511 |
| 6,242,754 B1 | 6/2001 | Shiraishi |

* cited by examiner

Primary Examiner—Robert H. Kim
Assistant Examiner—Richard H Kim
(74) Attorney, Agent, or Firm—Sterne, Kessler, Goldstein & Fox P.L.L.C.

(57) ABSTRACT

Coherent illumination is used to illuminate a symmetrical alignment mark with an image rotation interferometer producing two images of the alignment mark, rotating the images 1800 with respect to each other, and recombining the images interferometrically. The recombined images interfere constructively or destructively, in an amplitude and or polarization sense depending upon the method of recombination, when the alignment sensor is located at the center of the alignment mark. The rotation interferometer is preferably a solid glass assembly made of a plurality of prisms. A detector extracts the alignment information from the image rotation interferometer. The resulting center of the alignment mark is accurately determined. A relatively large number of different alignment mark patterns may be utilized, as long as the alignment mark patterns exhibit one hundred and eighty degree symmetry. Parallel lines, a grid pattern, or a checkerboard grating may be used. The alignment sensor may be applied to a scanning photolithographic system providing sinusoidal alignment signals. The alignment system is particularly applicable to photolithography as used in semiconductor manufacturing.

7 Claims, 7 Drawing Sheets

SELF REFERENCING MARK INDEPENDENT ALIGNMENT SENSOR

CROSS-REFERENCE TO RELATED APPLICATIONS

This application is a continuation of U.S. Ser. No. 09/553,270 (expected to issue as U.S. Pat. No. 6,628,940 on Sep. 30, 2003), filed Apr. 20, 2000, which is incorporated by reference herein in its entirety.

GOVERNMENT RIGHTS

The United States Government may have certain rights in the present invention pursuant to Contract No. NOOO14-96-0291 awarded by the Office of Naval Research.

FIELD OF THE INVENTION

The present invention relates in general to lithography used in the manufacture of semiconductor devices, and particularly to an alignment system.

BACKGROUND OF THE INVENTION

The manufacture of semiconductor devices uses a lithographic technique. It is often necessary to align or locate an object with a known reference coordinate system. In microcircuit lithography, the image of a reticle is projected onto a photosensitive substrate or wafer which is reproduced forming circuit patterns. Different processing steps often require different layers to be sequentially formed on the substrate to form a semiconductor device. Accordingly, it is often necessary to relocate the substrate with a high degree of accuracy. The substrate must be accurately positioned relative to prior patterns formed thereon. Alignment accuracy is often critical and typically is required to be less than 0.1 micron. Generally, an alignment mark or target is placed on a substrate to be aligned and is located with reference to a second object such as an alignment sensor. The position of the alignment mark, and therefore the substrate, is determined with respect to the alignment sensor coordinates. This is a critical step in alignment. The position of an alignment mark is normally defined with respect to the wafer plane and the center of symmetry of some portion of the alignment mark pattern. Typically an alignment sensor has an alignment axis that is normal to the plane of the substrate or wafer. Generally, alignment sensors require the use of a special alignment mark pattern, or a relatively restricted class of alignment mark patterns, that is placed on a substrate or wafer.

An alignment system is disclosed in U.S. Pat. No. 5,477,057 entitled "Off Axis Alignment System For Scanning Photolithography" issuing to David Angeley et al on Dec. 19, 1995, which is herein incorporated by reference. Therein disclosed is an alignment system having multiple detectors for detection of light scattered and reflected from alignment marks placed on a wafer. Another alignment system is disclosed in U.S. Pat. No. 5,559,601 entitled "Mask And Wafer Diffraction Grating Alignment System Wherein The Diffracted Light Beams Return Substantially Along An Incident Angle" issuing to Gallatin et al on Sep. 24, 1996, which is herein incorporated by reference. Therein disclosed is a grating-grating interferometric wafer alignment system utilizing a coherent illumination for determining alignment from the return electromagnetic radiation intensity. Another alignment system is disclosed in U.S. Pat. No. 5,767,523 entitled "Multiple Detector Alignment System For Photolithography" issuing to McCullough on Jun. 16, 1998, which is herein incorporated by reference. Therein disclosed is a detector having a photosensitive surface covered with an opaque layer having predetermined openings therein combined with a matched reticle having predetermined apertures.

While these and other alignment systems have performed adequately for their intended purpose, there is an increasing need for improving the accuracy of alignment systems. Additionally, there is a need for an alignment system that can utilize a relatively large class of alignment mark patterns.

SUMMARY OF THE INVENTION

The present invention is an alignment sensor that is self referencing to the center of symmetry of any mark having one hundred and eighty degree symmetry. An alignment mark having one hundred and eighty degree symmetry placed on the substrate is illuminated with coherent illumination. The image of the alignment mark is divided into two images. The images are rotated one hundred and eighty degree with respect to each other, and are coherently recombined with an interferometer. With proper phasing of the interferometer paths the recombined image will interfere constructively or destructively in amplitude in a detectable and identifiable way or combine to form detectable and identifiable polarization states when the axis of the alignment sensor is located at the center of the alignment mark symmetry. The alignment mark may be any class of mark having 1800 symmetry, such as alternating spaces and lines, a grid pattern, or a checkerboard pattern, including other symmetrical patterns. Preferably, a prism is used to form the two images, rotate the two images with respect to each other, and interferometrically recombine the two images. A detector detects the interference as a result of the recombined two images and locates the center of the alignment mark to accurately detect the position of the substrate.

Accordingly, it is an object of the present invention to provide improved alignment in a lithographic system used in the manufacture of semiconductor devices.

It is an advantage of the present invention that a mark having one hundred and eighty degree symmetry is used.

It is a feature of the present invention that two images of the alignment mark are coherently recombined in an interferometer to accurately identify the center of the alignment mark.

It is a feature of the present invention that a prism is used to divide, rotate, and recombine the image of an alignment mark having one hundred and eighty degree symmetry.

These and other objects, advantages, and features will become readily apparent in view of the following detailed description.

DETAILED DESCRIPTION OF THE PREFERRED EMBODIMENTS

Figure 1:
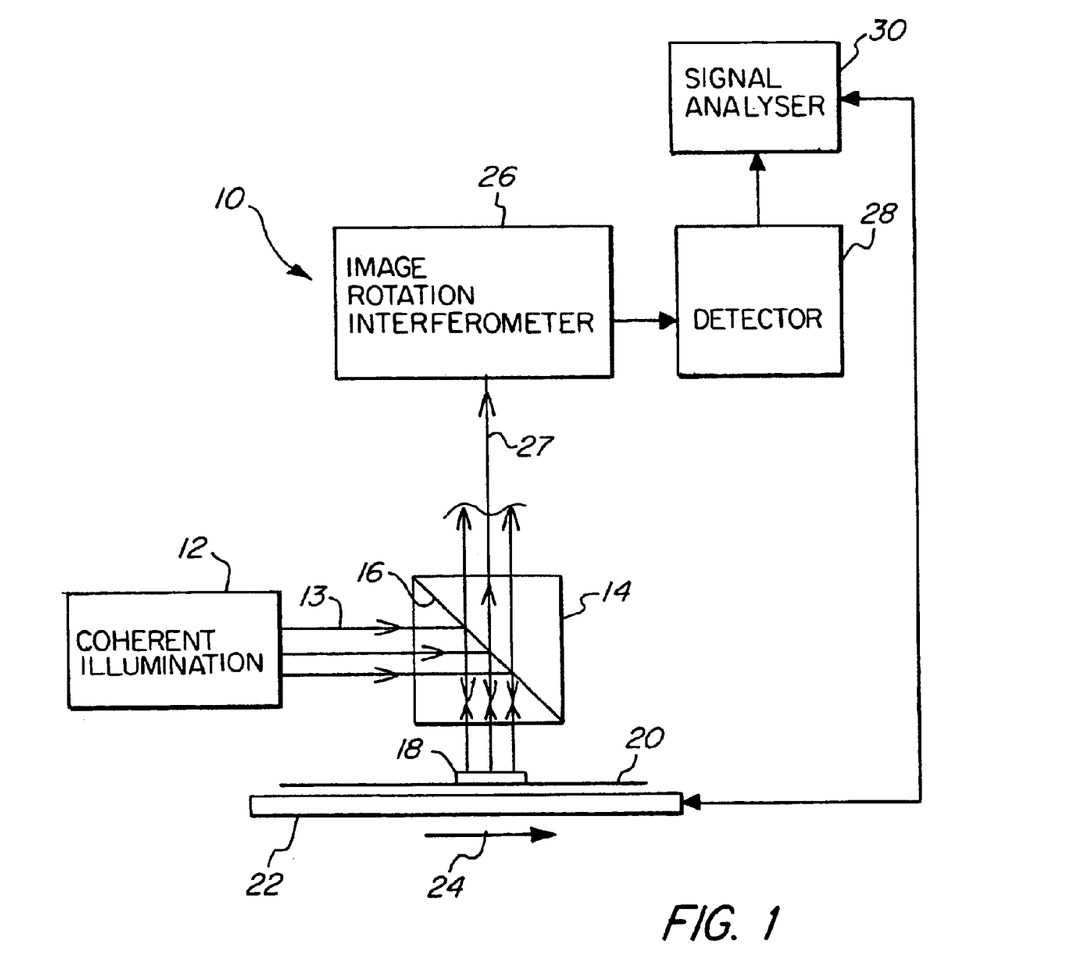
FIG. 1 schematically illustrates the alignment sensor of the present invention.

FIG. 1 is a schematic diagram illustrating the present invention. Alignment sensor 10 comprises a coherent illumination source 12, such as a laser, providing electromagnetic radiation 13, to a beamsplitter 14. A portion of the electromagnetic radiation is reflected off coating 16 to illuminate an alignment mark or target 18. The alignment mark or target 18 has one hundred and eighty degree symmetry. By one hundred and eighty degree symmetry, it is meant that when the alignment mark or target 18 is rotated one hundred and eighty degree about an axis of symmetry perpendicular to the plane of the alignment mark 18, the alignment mark is substantially identical to the unrotated alignment mark. The axis for which this is true is called the axis of symmetry. The alignment mark 18 is placed on or within a photosensitive substrate or wafer 20. The photosensitive substrate 20 is placed on a stage 22. The stage 22 may be scanned in the direction indicated by arrow 24. Electromagnetic radiation reflected from the alignment mark 18 passes through the beamsplitter 14 and is collected by the image rotation interferometer 26. It should be appreciated that a good quality image need not be formed, but that the features of the alignment mark should be resolved. The image rotation interferometer 26 may be any appropriate set of optical elements, and is preferably a combination of prisms, that form two images of the alignment mark, rotate one of the images with respect to the other one hundred and eighty degrees and then recombines the two images interferometrically so that when aligned with the alignment target 18, the electromagnetic radiation will interfere either in a polarization sense or in an amplitude sense, constructively or destructively, making readily detectable the center of the alignment mark 18. The optical ray passing through the center of rotation established by the interferometer, 26, defines the sensor alignment axis 27. Detectors 28 receive the electromagnetic radiation from the image rotation interferometer 26. The detectors 28 then provide signals to the signal analyzer 30. The signal analyzer 30 is coupled to the stage 22 such that the position of the stage is known when the center of alignment mark 18 is determined. Therefore, the position of the alignment mark 18 is very accurately known with reference to the stage 22. Alternatively, the location of the alignment sensor 10 may be known such that the center of the alignment mark 18 is known with reference to the alignment sensor 10. Accordingly, the exact location of the center of the alignment target 18 is known relative to a reference position. Thereby, by using an alignment mark of a class that is one hundred and eighty degree symmetrical in combination with an image rotation interferometer, the alignment system is self referencing to the center of the alignment mark. This makes possible the use of a wide variety of alignment marks that need only be one hundred and eighty degree symmetrical. Additionally, the center of the mark may be very accurately determined even with a relatively poor image.

Figure 2A:
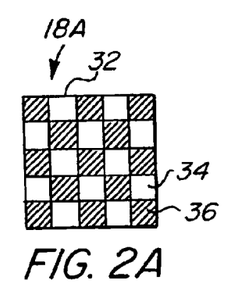
FIGS. 2A–E are plan views illustrating different alignment marks having one hundred and eighty degree symmetry.

FIGS. 2A–E are plan views of examples of different possible alignment marks. It should be appreciated that FIGS. 2A–E are only examples of different alignment marks and that many different one hundred and eighty degree symmetrical alignment marks may be utilized in practicing the present invention that can readily be determined by one skilled in the art based on the teachings of the present invention. FIG. 2A illustrates a square grid checkerboard alignment target 18A. The target 18A is comprised of a plurality of two types of optically different squares, 34 and 36. The two types of squares may be differentiated by pattern, reflectance (amplitude and/or phase), or any combination of these. Alignment mark 18A functions primarily like two linear gratings oriented at right angles with respect to each other; one at an angle of +45 degrees with respect to the orientation of edge or line 32 and the other at an angle of −45 degrees with respect to edge or line 32.

Alignment mark 18A, when rotated one hundred and eighty degree about an axis perpendicular to its plane results in a substantially identical pattern or mark. Therefore, alignment mark 18A is one hundred and eighty degree symmetrical.

Figure 2B:
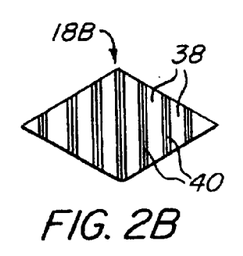

FIG. 2B illustrates a diamond shaped alignment mark 18B. The alignment mark 18B is comprised of a plurality of vertical equally spaced lines 40 having spaces 38 there between. When the alignment mark 18B is rotated one hundred and eighty degree about an axis perpendicular to the plane of the alignment mark 18B, a substantially identical pattern or mark is formed. Therefore, alignment mark 18B is one hundred and eighty degree symmetrical.

Figure 2C:
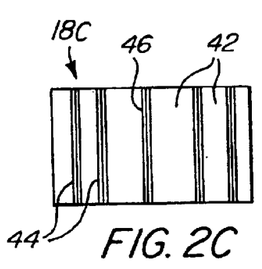

FIG. 2C illustrates another alignment mark 18C. The alignment mark 18C has a plurality of lines 44 separated by spaces 42. The spaces 42 are of different spacing or dimensions. Therefore, the lines 44 have a different pitch or period. The different periods of lines 44 are symmetrical about a central line 46. Therefore, when the alignment target 18C is rotated one hundred and eighty degree about an axis perpendicular to the plane of the alignment mark 18C, a substantially identical pattern or mark is formed. Therefore, alignment mark 18C is one hundred and eighty degree symmetrical.

Figure 2D:
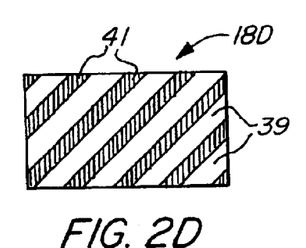

FIG. 2D illustrates another alignment target 18D. Alignment target 18D has alternating lines, which may be spaces 39 and lands 41. The spaces 39 and the lands 41 are angled forty-five degrees with respect to the longitudinal axis of the alignment target 18D.

Figure 2E:
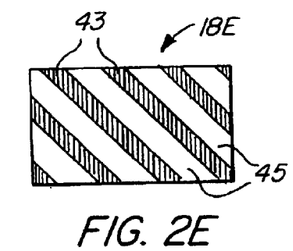

FIG. 2E illustrates another alignment target 18E. Alignment target 18E has alternating lines, which may be spaces 45 and lands 43. The spaces 45 and the lands 43 are angled forty-five degrees with respect to the longitudinal axis of the alignment target 18E.

Figure 3A:
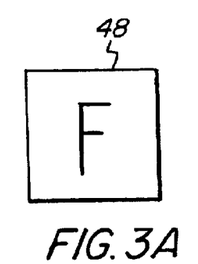
FIGS. 3A–E are plan views illustrating the dividing, rotating, and recombining of an image.
Figure 3B:
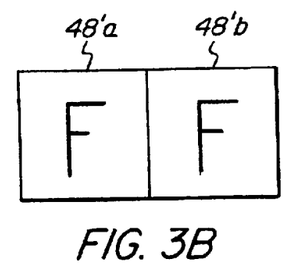
Figure 3C:
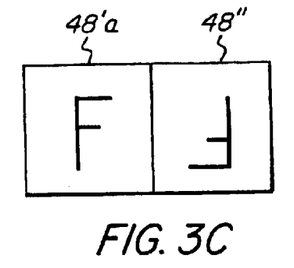
Figure 3D:
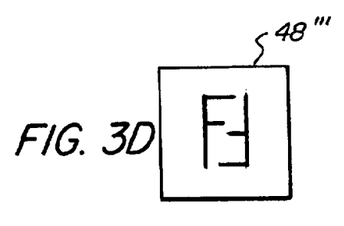
Figure 3E:
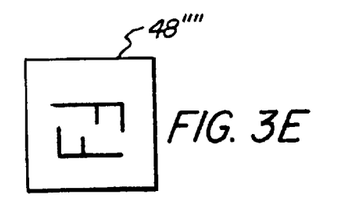

FIGS. 3A–E illustrates the image manipulation of the alignment sensor of the present invention, and in particular the image rotation interferometer 26, illustrated in FIG. 1. FIG. 3A illustrates the formation of an image 48. For illustrative purposes, the image has been selected as the letter F. However, it should be appreciated in practicing the present invention that the image of a one hundred and eighty degree symmetrical alignment mark would be formed. The letter F is not a one hundred and eighty degree symmetrical mark. FIG. 3B illustrates the formation of two images 48a' and 48b' of the image 48, illustrated in FIG. 3A. FIG. 3C illustrates rotating one of the images 48a' or 48b', illustrated in FIG. 3B, with respect to the other image forming a one hundred and eighty degree rotated image 48". FIG. 3D illustrates the recombining of image 48a' and image 48", which is rotated one hundred and eighty degrees illustrated in FIG. 3C to form an interferometrically recombined image 48'". FIG. 3E illustrates the recombining of the left image 48a' of FIG. 3B when it is rotated +90 degrees and right image 48b' of FIG. 3B when it is rotated −90 degrees to form an interferometrically recombined image 48"". Because the alignment mark is one hundred and eighty degree symmetrical, the recombined image will interfere constructively or destructively when the axis of the alignment sensor is exactly over the alignment mark center of symmetry. This results in accurate detection and therefore location of the center of the alignment mark. It should be appreciated that the optical manipulation of the image of an alignment mark may be performed in a number of different equivalent ways. It is only the end result of forming a first image of the alignment mark and a second image of the alignment mark rotated one hundred and eighty degrees relative to the first image that is essential. For example, if two images are formed both images could be rotated ninety degrees in opposite directions to form the required two images rotated one hundred and eighty degrees with respect to each other.

Figure 4A:
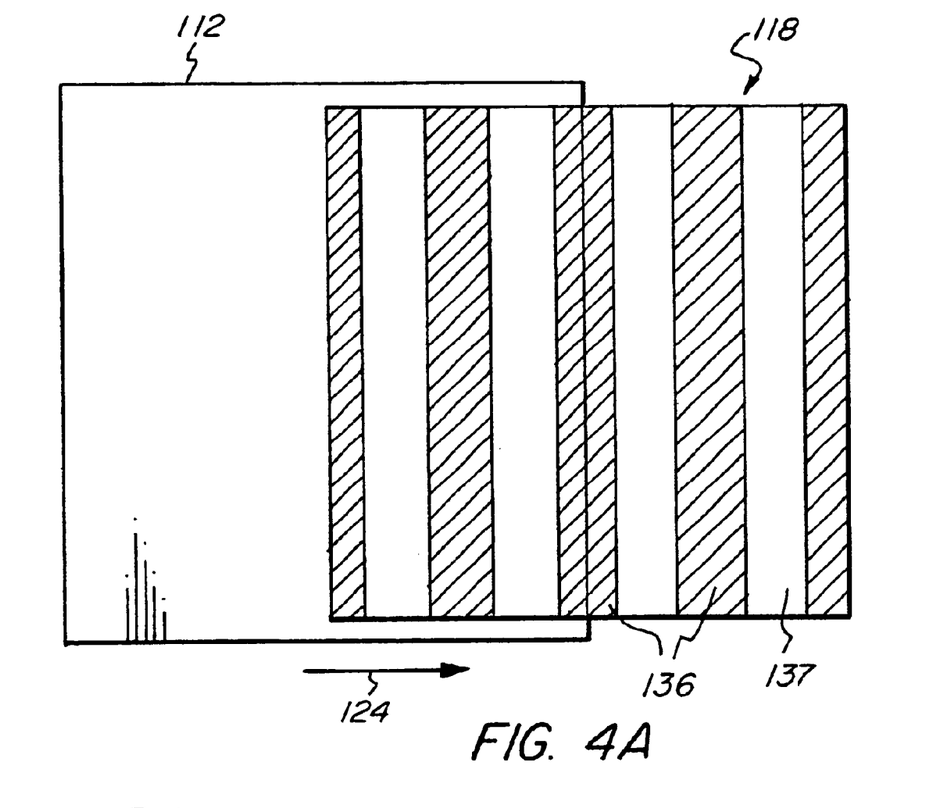
FIG. 4A is a plan view illustrating scanning of an alignment mark.
Figure 4B:
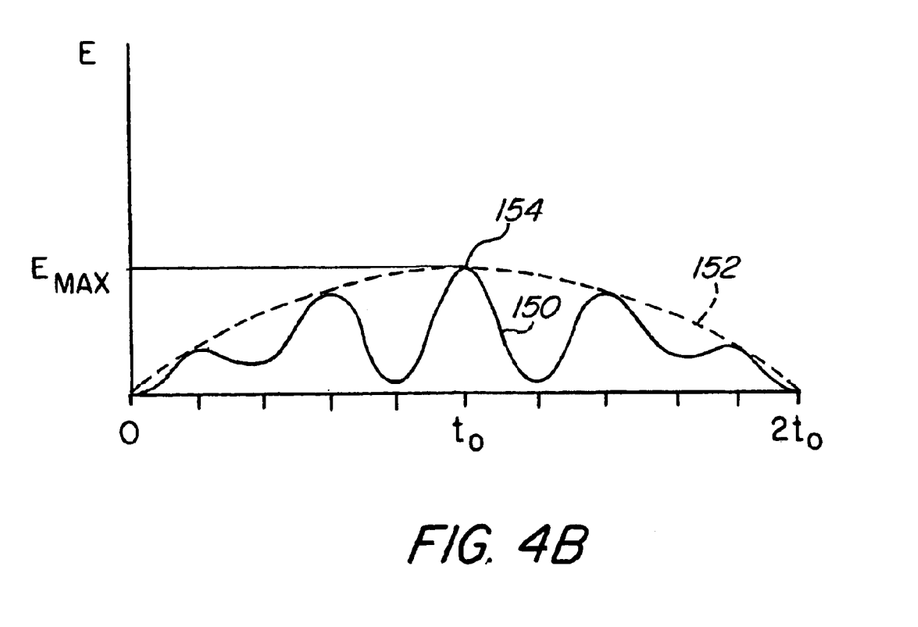
FIG. 4B is a graph illustrating an alignment signal and the identifying of a center of the alignment mark.

FIG. 4A–B illustrates the application of the present invention to a scanning sensor or wafer which could be part of a scanning photolithographic system. In FIG. 4A coherent illumination 112 scans an alignment target 118 comprised of vertical lines 136 and spaces 137. Arrow 124 indicates the relative direction of scan. Generally, the illumination 112 will be stationary and the alignment target 118 will move relative thereto. FIG. 4B is a graph illustrating energy as a function of time. Curve 150 represents a signal obtained by a scanning alignment system of the present invention. The signal 150 is contained by an envelope function 152. Point 154 represents the maximum energy or height of the envelope function 152. This maximum height or point 154 occurs at a time to representative of the coincidence of the mark center and the sensor alignment axis 27, illustrated in FIG. 1.

Figures 5A, 5B:
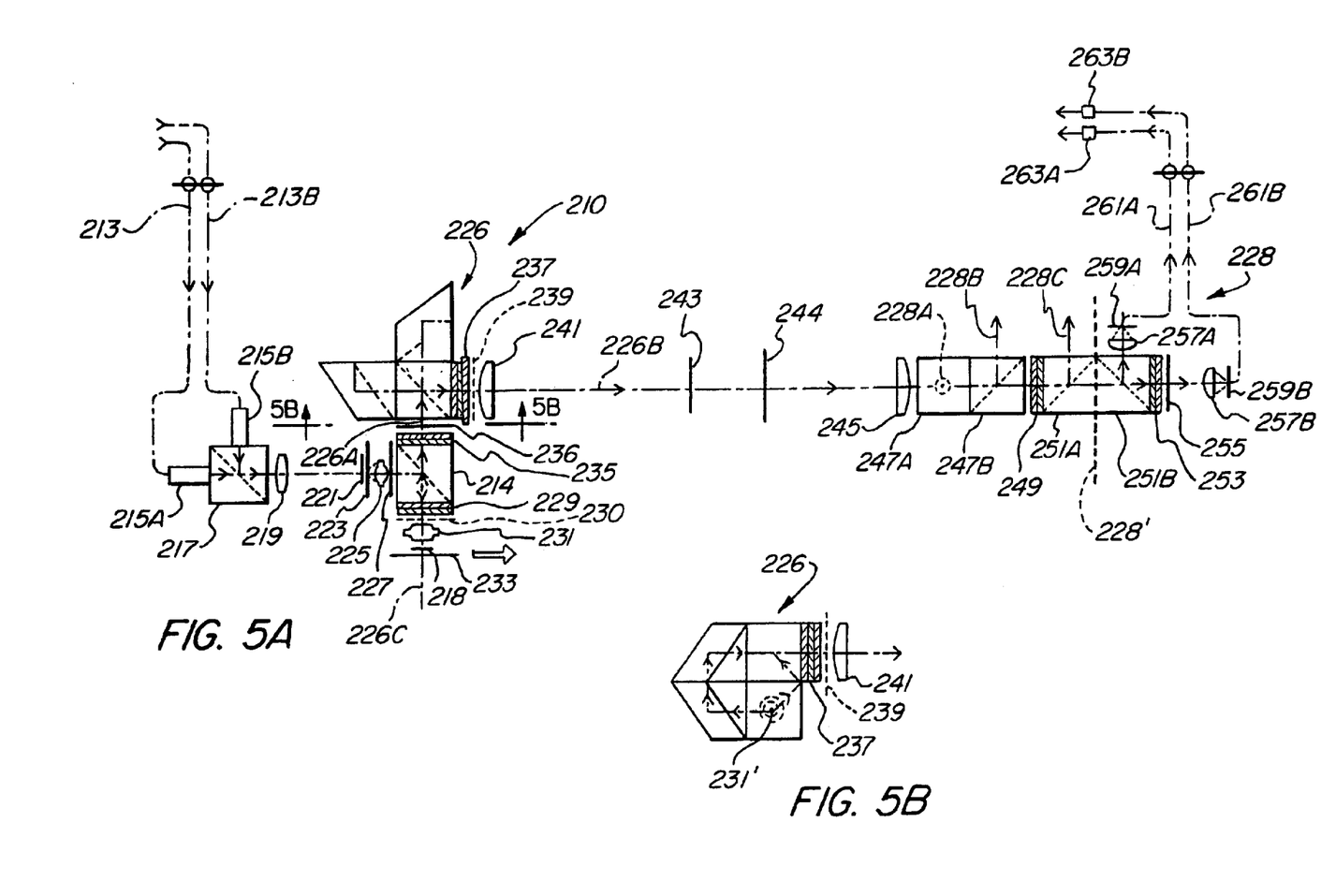
FIG. 5A is a schematic illustration of a preferred embodiment of the present invention.
FIG. 5B is a cross section taken along line 5B—5B in FIG. 5A.

FIG. 5A–B illustrates in more detail an embodiment of the present invention. The alignment sensor 210 receives coherent electromagnetic radiation from a source, not illustrated, from a single-mode polarization-preserving optical fiber 213A. The optical fiber 213A may transmit two wavelengths of electromagnetic radiation, preferably at 635 and 680 nanometers. Another single-mode polarization-preserving optical fiber 213B may be utilized for transmitting three longer wavelengths, preferably at 780, 830, and 880 nanometers. Fiberoptic couplers 215A and 215B, respectively, may be used to collimate the output of the optical fibers 213A and 213B to enter a loss less wavelength based beam combiner cube 217. However, it is possible to combine the two optical fibers 213A and 213B with a single optical fiber, eliminating the need for the beam combiner cube 217. The wavelengths should have S-polarization, linear polarization perpendicular to the plane of the page. Adjacent to the beam combining cube 217 is a lens 219. Lens 219 provides illumination pupil correction. Line 221 represents the location of the corrected pupil plane, which is adjacent to stop 223. The stop 223 is preferably a square, but may have other shapes such as a circle, or diamond. Lenses 219, 225, and 231 are selected and spaced along with pupil plane 221 to provide a nominally constant phase and uniformly illuminated image of stop 223 at the substrate plane or wafer 233 having an alignment target 218 thereon. These imaging conditions do not need to be met exactly for the sensor to function properly. The most critical requirement is the maintenance of one hundred and eighty-degree symmetry about the interferometer-defined alignment axis. Optional stop 227 may be used to limit the diameter of lens 225 thereby limiting the substrate illumination numerical aperture to a predetermined value, preferably approximately 0.2. An achromatic polarization-based beamsplitter cube 214 is used to reflect the incident S-polarized illumination toward the substrate 233 and transmits P-polarization illumination from the substrate 233 toward a rotation interferometer prism 226.

An achromatic quarter wave plate 229 is placed adjacent to the beamsplitter cube 214 to convert the incident linear S-polarization into right or left circularly polarized light illuminating the wafer mark or alignment target 218. Although not required, it is useful here to consider the alignment target 218 to be of the form of the checkerboard grating 18A shown in FIG. 2A with the horizontal and vertical lines parallel and normal to the page. Thus, the checkerboard gratings are oriented at 145 degrees with respect to the page. The most desirable alignment mark scan direction is parallel to either the horizontal or vertical lines. Achromatic quarter waveplate 229 also converts the desired portion of the substrate-scattered light, including the non-diffracted zero-order, into the linear P-polarized light that is transmitted by the beamsplitter 214. An achromatic half-wave waveplate 235 may be placed adjacent to the beamsplitter cube 214 in lieu of rotating the rotation interferometer 226 forty-five degrees about the axis of lens 231. The rotation interferometer 226 is a plurality of prisms combined to effectively provide two images of the alignment target 218, rotate one image one hundred and eighty degree with respect to the other, and interferometrically recombine the images. The rotation interferometer 226 may be polarization based. Typically, the rotation interferometer 226 can have a rotation error of approximately t five milli-radians. Typically, the optical path difference between the two arms should be less than two waves. Typically, the phase difference between the Sand P polarization reflections should be less than t ten degrees. The alignment axis is refined by interferometer 226 centerline ray 226A and 226B and the extension of this ray as it propagates throughout the sensor optics. Ray 226C is the alignment axis extended to wafer target 218. Adjacent to the rotation interferometer 226 is chromatic wave-plate assembly 237. Chromatic wave-plate assembly 237 is designed and adjusted to compensate for any small phase errors or path difference between the two paths within the rotation interferometer 226. Waveplate assembly 237 can be placed at either the entrance or exist of the interferometer. Dashed line 239 represents a plane that separates the alignment system 210 into two groups. Prior to this plane, the optical components just described generate the optical position signals. The components beyond this plane separate the signals and the first order intensities.

Adjacent to plane 239 is positioned a relay comprising two lenses 241 and 245. These lenses are selected and spaced to simultaneously image wafer plane 233 onto plane 243 and pupil plane 221 onto planes 244 and 255. There is an intermediate image of pupil plane 221 which is typically located between plane 230 and plane 236 or 239. An optional stop, with a clear region that is the nominal size of the image of the wafer plane illumination spot, can be placed in plane 243 to block undesired stray light. In addition, an optional stop can be placed in plane 244 to reject undesired stray light, to block undiffracted light, or to select desired portions of the diffracted light. Adjacent to lens 245 are beamsplitter cubes 247A and 247B. Beamsplitter cubes 247A and 247B are polarization based mostly transmitting beamsplitter cubes that transmit all of the local P-polarization while reflecting approximately five to ten percent of the S-polarization and transmitting the balance of the S-polarization. The beamsplitter cubes 247A and 247B are oriented with respect to interferometer 226 and rotated 90° with respect to the other so that the final light transmitted has the same polarization state as the light incident upon beamsplitter 247A. Output light 228A comes entirely from one path within interferometer 226 and output light 228B comes entirely to the other path within interferometer 226. Following beamsplitter cube 247B is achromatic half-wave waveplate 249, which is oriented to rotate the transmitted polarization forty-five degrees. Following waveplate 249 is achromatic polarization based beamsplitter cube 251A. Alternatively, waveplate 249 can be omitted if beamsplitter 251A and the subsequent components are rotated either t45 degrees about alignment axis 226B. Beamsplitter cube 251A serves as an analyzer for polarization based rotation interferometer 226 generating two complementary alignment signals. One output is proportional to the sum of the two image fields. The other output is proportional to the difference between the two fields. The beamsplitter cube 251A reflects S-polarization illumination upward along pate 228C and transmits P-polarization. With proper optical tolerances and wave plate orientations, the wafer or substrate zero order will be S-polarized and hence exits beamsplitter 251A along with the alignment position signal pair that is complementary to the transmitted signals. A detector assembly 228 is positioned beyond the plane 228'. Detector assembly 228 includes an achromatic polarization-based beamsplitter cube 251B. The beamsplitter cube 251B is used in conjunction with a quarter wave plate 253 and a mirrored stop 255. Beamsplitter cube 251B transmits the incident P-polarization through quarter wave plate 253. Mirror stop 255 is located in an image of plane 244 and is a mirror with clear areas that transmit diffraction for the alignment mark gratings oriented at +45 degrees to the page and reflects diffraction for the alignment mark gratings oriented at −45 degrees to the page. Typically, the transmitted and reflected diffraction will be both first-order diffraction orders associated with each grating's orientation although only one of the diffraction orders is required. One signal, pair of diffraction orders, is transmitted through mirror stop 255. The other signal, pair of diffraction orders, is reflected from mirror stop 255 and travels back through quarter-wave waveplate 253 for the second time so that it is converted into S-polarized light and reflected upward by beamsplitter 251B. Collection lenses 257A and 257B collect the alignment signal position light typically forming a third image of the alignment mark 218 at collector stops 259A and 259B, respectively. The signal is transmitted by multi-mode optical fibers 261A and 261B, respectively. Photodetectors are positioned at outputs 263A and 263B providing the basic alignment position signals. The optics and detectors following plane 228' can be duplicated at 228C to provide complementary signals. Either or both complementary signal pairs can be used. This requires either two or four photodetectors.

The optics and detectors following plane 228' can be duplicated with beamsplitter 251A replaced by solid glass cube at both 228A and 228B creating two output channels. In each channel mirror stop 255 is replaced by a modified mirror stop that selects one of the two incident first orders, transmitting one and reflecting the other. This requires four photodetectors. These four signals will give information about the alignment mark and in particular about mark symmetry. The inclusion and use of these optics and signals at beamsplitters 247A and 247B are optional. It should be appreciated that the use of wave-plates including 235, 249, as well as others may be optional, depending upon the use of polarization beamsplitters and the relative orientation of polarization sensitive components.

If several different illumination wavelengths illuminate mark 218, the signals from each wavelength may be separated at any point after the mark. A particularly convenient wavelength separation region is the multimode fibers 261A and 261B just before the photodetectors positioned at outputs 261A and 261B. Then there should be an additional set of photodetectors for each wavelength.

While the embodiment illustrated in FIG. 5A has eight outputs, four outputs comprising the two complementary pairs of alignment positions signals generated by interfering opposing first orders and four outputs comprising four first order diffraction amplitudes, all outputs are not likely to be needed. It is estimated that only two outputs may actually be needed.

FIG. 5B is a cross section taken along line 5B—5B in FIG. 5A. The electromagnetic radiation enters the rotation interferometer 226 at 231'. The electromagnetic radiation exits the rotation interferometer 226 through wave plate 237 and relay lens 241.

Figure 6A:
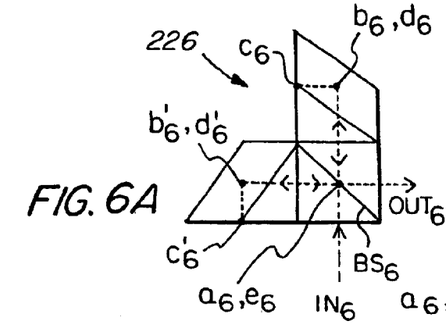
FIG. 6A is the side view of a prism utilized in one embodiment of the present invention.
Figure 6B:
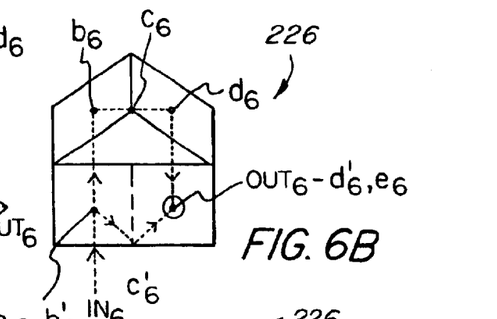
FIG. 6B is a top view of the prism illustrated in FIG. 6A.
Figure 6C:
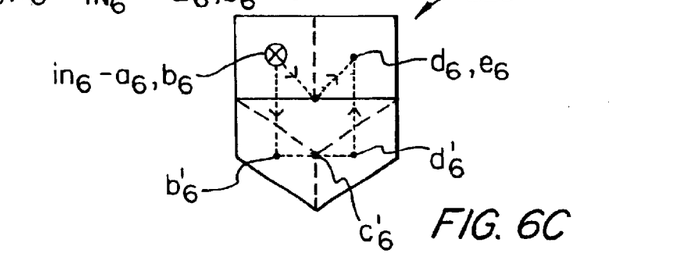
FIG. 6C is a bottom view of a prism illustrated in FIG. 6A.

FIGS. 6A–C illustrate different views of the rotation interferometer 226 illustrated in FIGS. 5A and 5B. The prism configuration of the rotation interferometer 226 is of the Mach-Zehnder type. This interferometer can be constructed from two prisms joined at beamsplitter surface $BS_6$. Optical ray path: $in_6$-$a_6$-$b_6$-$c_6$-$d_6$-$e_6$-$out_6$ and path: $in_6$-$a_6$-$b_6'$-$c_6'$-$d_6'$-$e_6$-$out_6$ define the interferometer alignment axis. Each letter callout dot represents a reflection point or beamsplitter BS intersection point of the alignment axis centerline. Approximately, one-half of the energy follows each path. The reflections at $b_6$-$c_6$-$d_6$ and $b_6'$-$c_6'$-$d_6'$ reflect the associated rays out of the plane of the figure. Observed along the output ray $e_6$-$out_6$, these out-of-plane reflections rotate an image plane perpendicular to the ray. Because the orientation of the two mirrors associated with the reflections at $b_6$ and $d_6$ are reversed with respect to the orientation of the two mirrors associated with the reflections at $b_{6'}$ and $d_{6'}$, the images associated with the two paths are rotated in opposite directions. The mirror angles are selected so that the relative image rotation is one hundred and eighty degrees. The set of desired mirror angles is not unique. The set of symmetric mirror angles shown is particularly convenient. This set of angles is unique. This set of angles is described in detail with respect to FIG. 7A–D. Beamsplitter and mirror coatings must be designed to control the relative phase shift between the two interferometer paths to maintain proper constructive and destructive interference between the two rotated images. One useful coating solution follows. Use identical reflective coatings on the four mirrors reflecting at $b_6$, $d_6$, $b_6'$, and $d_6'$. Use metallic type coatings with negligible phase shift between S-polarization and P-polarization states on the two mirrors reflecting at $c_6$ and $c_6'$. Use a symmetric coating for beamsplitter surface $BS_6$.

This interferometer is particularly useful because no light can return toward the input direction, even with small fabrication errors.

Figures 7A, 7B:
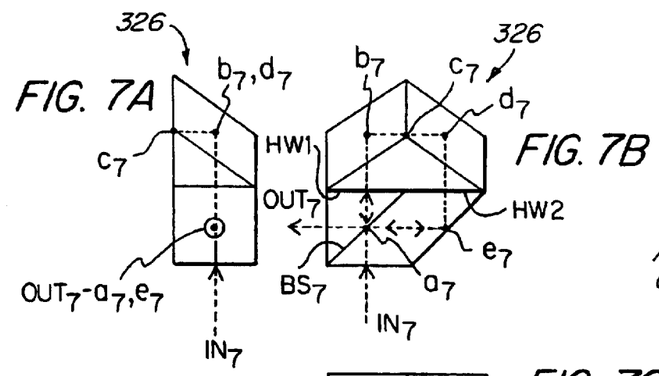
FIG. 7A is a side view of a prism of a second embodiment of the present invention.
FIG. 7B is a top view of the prism illustrated in FIG. 7A.
Figure 7C:
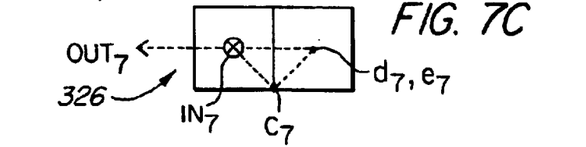
FIG. 7C is a bottom view of the prism illustrated in FIG. 7A.
Figure 7D:
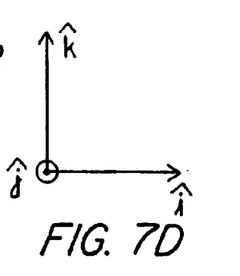
FIG. 7D represents a coordinate system.

FIG. 7A–D illustrate different views of another type or embodiment of a rotation interferometer 326. Rotation interferometer 326 has an interferometer configuration of the Sagnac ring type. This interferometer can be conveniently constructed from the three prisms shown. The prisms are joined at beamsplitter surface BS7 and the surface defined by HW1 and HW2. The coincidence of the overlap region $a_7$-$out_7$ from optical ray path: $in_7$-$a_7$-$b_7$-$c_7$-$d_7$-$e_7$-$a_7$-$out_7$ and path: $in_7$-$a_7$-$e_7$-$d_7$-$c_7$-$b_7$-$a_7$-$out_7$ define the interferometer alignment axis. Each letter callout dot represents a reflection point or beamsplitter $BS_7$ intersection point. Approximately one-half of the energy follows each path. The reflections at $b_7$-$c_7$-$d_7$ reflect the associated rays out of the plane of the figure. Observed along the output ray $a_7$-$out_7$, these out-of-plane reflections rotate an image plane perpendicular to the ray. Because the reversed order of reflection at the out-of-plane mirrors, $b_7$-$c_7$-$d_7$ for the clockwise path and $d_7$-$c_7$-$b_7$ for the counterclockwise path the images associated with the two paths are rotated in opposite directions. The mirror angles are selected so that the relative image rotation is one hundred and eighty degrees. The set of desired mirror angles is not unique. The set of symmetric mirror angles shown is particularly convenient. This set of angles is unique. With respect to the conventional Cartesian unit vectors shown in FIG. 7D, the unit normal for the mirror reflecting at point $b_7$ is:

$$\frac{1}{2}\hat{i} - \frac{1}{2}\hat{j} - \frac{1}{\sqrt{2}}\hat{k}$$

The unit normal for the mirror reflecting at point d7 is:

$$-\frac{1}{2}\hat{i} - \frac{1}{2}\hat{j} - \frac{1}{\sqrt{2}}\hat{k}$$

The corresponding mirrors in FIG. 6A–6C have similar orientations. It is preferred if the beamsplitter is polarization-based! reflecting S-polarization and transmitting P-polarization. The associated illumination should be coherent with nominally equal S-polarization and P-polarization energies. With this equal energy constraint! the interferometer can be designed to accept any specified elliptical polarization state. It is preferred to insert a half-wave waveplate at location HWI or HW2 oriented to rotate the incident polarizations +90 degrees. For this preferred configuration! all of the energy leaves the interferometer form the output face—no light returns toward the input face. The coatings must be designed with care to insure proper phase relationships for the S-polarization and P-polarization associated with the clockwise and counterclockwise paths to provide the desired constructive and destructive interference of the two images. In addition to coating design proper phase relationship can be established with the use of polarization sensitive waveplates and coatings external to the interferometer at either the input or output. The polarization compensator shown at 237, in FIG. 5A, is an example of external compensation.

This interferometer is desirable because it is compact, particularly tolerant of small fabrication errors, and has inherently equal paths for the two images when coatings are considered. Interferometers 226 and 326 can best be understood as rotating one of the two images one hundred and eighty degrees with respect to the other image.

Figure 8A:
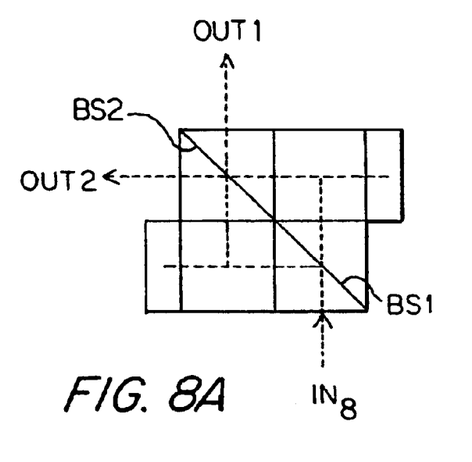
FIG. 8A is a side view of a prism utilized in a third embodiment of the present invention.
Figure 8B:
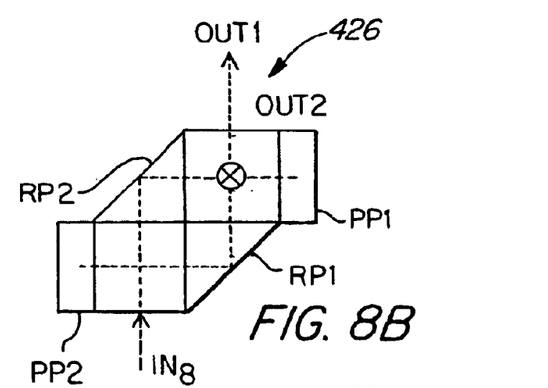
FIG. 8B is a side view of the prism illustrated in FIG. 8A.
Figure 8C:
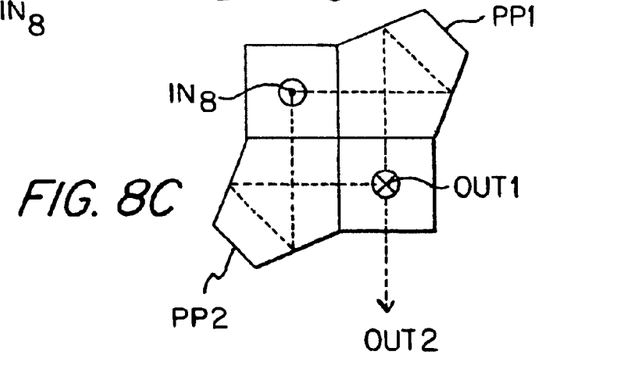
FIG. 8C is a bottom view of the prism illustrated in FIG. 8A.

FIGS. 8A–C illustrate yet another embodiment of a rotation interferometer 426. The rotation interferometer 426 is another interferometer of the Mach-Zehnder type. This interferometer is composed of two beamsplitter cubes BS1 and BS2, two right angle prisms PP1 and PP2, and two pentaprisms PP1 and PP2. Light enters at ins, and leaves at either both out1 and out2 depending upon the election of mirror and beamsplitter coatings and the addition of internal waveplates.

It is possible to form another embodiment from a beamsplitter cube and two Porro prisms. The Porro prisms are placed on two faces of the beamsplitter cube adjacent to the beamsplitting surface. The Porro prisms are oriented so that their central vertices are at ninety degrees to each other. Polarization and nonpolarization-based configurations can be designed by the appropriate selection of coatings and the addition of waveplates. This is an interferometer of the Michelson type.

Interferometer 426 and the Porro prism based interferometer can best be understood as providing the desired one hundred and eighty degree image rotation by performing an x-axis fold of one of the two images followed by an y-axis fold of either of the images. This double fold is mathematically identical to rotating one image 180 degrees with respect to the other.

It should be noted that it is possible to form a one-axis alignment sensor related to the preceding from an image folded about its center of symmetry.

All of these different embodiments of rotation interferometers 226, 326, and 426 form two images of an alignment mark, rotate one image by one-hundred and eighty degrees relative to the other image and recombine the two images interferometrically to determine the center of the alignment mark. Although less efficient, these interferometers and the alignment sensor can function with non-polarization-based beamsplitters.

Figure 9:
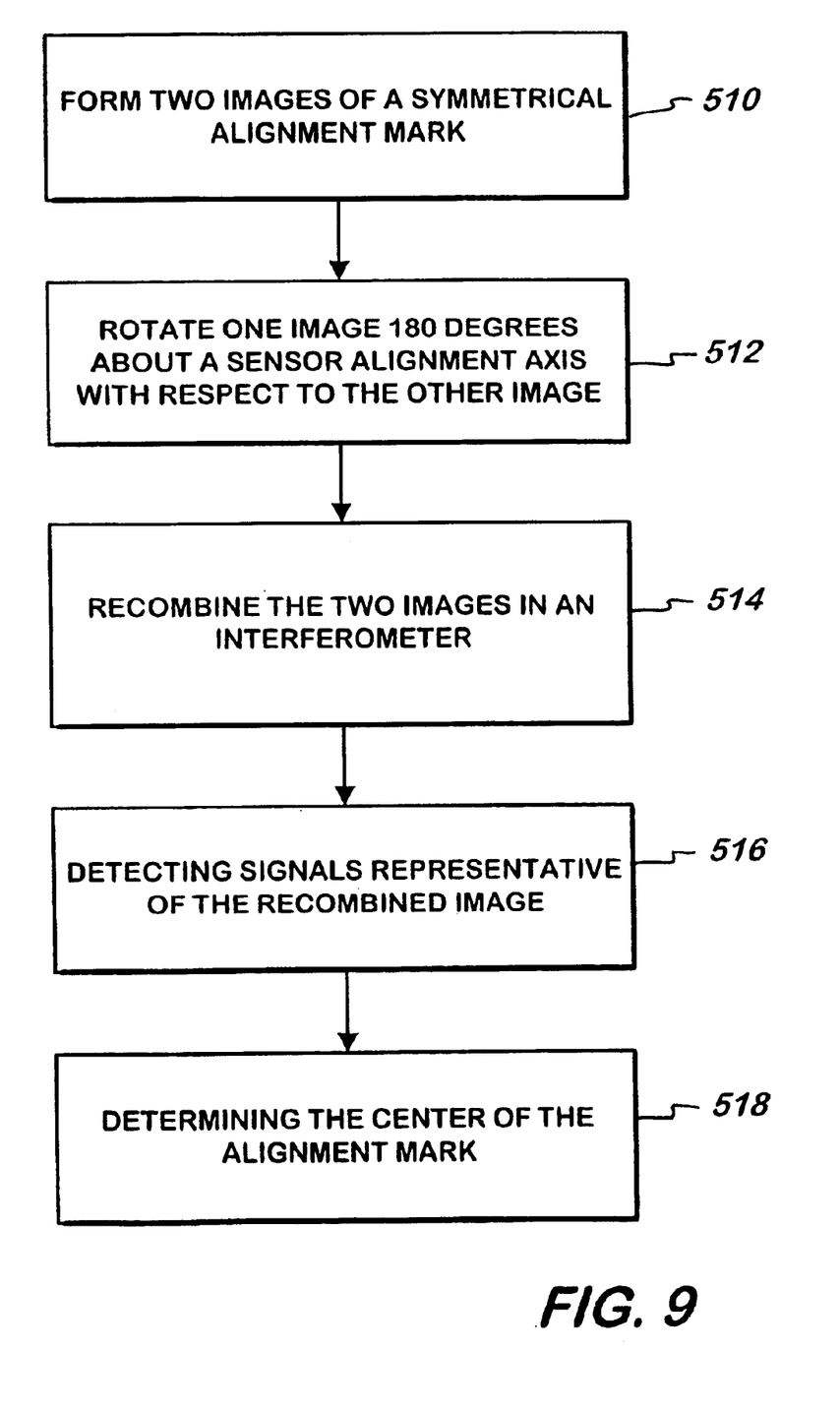
FIG. 9 is a block diagram illustrating the method steps of the present invention.

FIG. 9 is a block diagram illustrating the method steps or acts of the present invention. Box 510 represents the act or step of forming two images of a one hundred and eighty-degree symmetrical alignment mark. Box 512 represents the step or act of rotating one of the two images with respect to the other image. Box 514 represent the step or act of recombining the two images in an interferometer. Box 516 represents the step or act of detecting signals representative of the recombined image. Box 518 represents the step or act of determining the center of the alignment mark based upon the detected signals.

Referring to FIGS. 1–9, the operation of the present invention should be readily appreciated. The alignment sensor of the present invention is self referencing to the center of symmetry of any mark with one-hundred and eighty degrees of symmetry. One or two dimensional alignment marks, typically linear gratings and checkerboard gratings, are preferred. The alignment sensor works from a general interferometric principle to generate sinusoidal alignment signals. The sensor coherently divides the coherently illuminated alignment mark image into two images. One of the images is then rotated one-hundred and eighty degrees with respect to the other. The images are coherently recombined and aligned so that the two separate image paths are substantially exactly equal. The recombined image then interferes constructively or destructively, in amplitude or in polarization state depending upon the interferometer configuration, when the alignment sensor axis is located at the center of the alignment mark symmetry. With either amplitude or polarization state interference, two complementary images are formed, one exhibits constructive interference and is bright, and the other exhibits destructive interference and is dark or black. The present invention illuminates an alignment mark with light or electromagnetic radiation that is spatially coherent with respect to the same one-hundred and eighty degree symmetry about the alignment sensor axis. A particularly convenient illumination is spatially coherent collimated light with a wavefront perpendicular to the sensor axis and with a centered circular intensity profile. Alternately, any wavefront with a slight defocus or radial wavefront aberration may be used. Depending upon the application, an apodized circular, rectangular, or square intensity distribution that is smaller or larger in extent than the alignment mark is useful. The minimum requirement is the mentioned one-hundred and eighty degree spatially coherence illumination. Thus, the illumination can be generated from an extended or spatially incoherent source without discarding most of the light. The illumination source can contain a continuous range or several discreet wavelengths. Typically, the light should be polarized with a state that is symmetric with respect to the pattern symmetry. For the preferred use of parallel lines and checkerboards as alignment marks, either left or right circularly polarized light may be used, but other polarization states are usable. The image quality of the alignment sensor is not critical as long as one-hundred and eighty degree symmetry is preserved for each image with proper local interference. Thin film polarizing beamsplitters may be used. However, they may require a polarization analyzer to create the two complementary images. Lossy beamsplitters may also be used. Preferably, a sequence of beamsplitters and reflections in the form of a solid glass prism interferometer assembly may be used to provide a rotation interferometer to separate, rotate, and recombine the two images. A similar construction is also possible using diffraction gratings replacing the thin film beamsplitters. Although not required, it may be useful to spatially filter the image in order to enhance performance. It is generally useful to retain the diffracted light, that is light spatially modulated by the alignment mark pattern, and to reject both the unmodulated zero-order and randomly scattered light. In addition, it may be useful to reject higher diffraction orders from periodic marks. The image can be spatially filtered either before or after the rotational step. If the illumination underfills a periodic mark while still illuminating many mark periods, the recombined images will exhibit maximum constructive or destructive interference whenever the sensor axis is at a center of the mark symmetry and the illumination completely scans the mark. Thus, if a one dimensional periodic mark pattern moves past the alignment sensor axis at a constant velocity in the direction normal to the pattern feature edges, as in a scanning lithographic system, alignment data is collected. The total energy in each of the complementary images varies periodically. A particularly desirable alignment mark is a one dimensional grating composed of bars in the form of equally spaced lines and spaces. When such a mark image is spatially filtered to retain only the two first diffraction orders, the total energy in each of the two complementary images varies sinusoidally as a function of the mark position thereby providing a useful alignment signal. The total energy in one image is of the form: $1+\text{Cos}(4\pi V(t-t_0)/P)$ where V is the wafer stage velocity normal to the pattern lines, t is time, $t_0$ is the time at which the center axis at the center of symmetry of an alignment mark period, and P is the mark period. The alignment mark sensor position estimate is the mark location at the time t=to. The complementary image energy is of the form: $1-\text{Cos}(4\pi V(t-t_0)/P)$. The entire signal has a slowly varying symmetric envelope factor with an increasing and a decreasing value for its leading and trailing edges, produced as the alignment mark moves into and then out of the illumination area respectively. The envelope factor is symmetrical about the time $t=t_0$. For symmetric alignment marks, the alignment signal and the complementary alignment signal contain the same alignment information. A two dimensional periodic pattern, such as a checkerboard grating, can produce simultaneous x-position and y-position estimates if the recombined image is spatially filtered and separated into two one-dimensional periodic images with the energy of each image collected separately. This produces two independent alignment signals. The positional ambiguity implied by the periodic nature of a sinusoid can be eliminated by the use of appropriate pre-alignment precision. Alternately, it can be eliminated by the use of one or more of the following: determination of the center of the entire alignment signal including the envelope factor, the use of two or more periodic alignment marks of slightly different periods, the use of non-periodic patterns including isolated features and lines or checkerboards of variable but symmetrical patterning. Since the alignment signal does not depend upon conventional image formation, the alignment sensors will operate over a relatively large depth of focus. A relative image rotation angle of approximately one-hundred and eighty degrees is preferable, although other angles may be used. One image may be folded about the normal to the alignment sensitive direction providing a single axis alignment sensor. This folding can be repeated about a second axis to provide alignment information for the other axis. The required interferometric image manipulation may be performed in a number of ways in combination with various optical components. Preferably, the required interferometric image manipulation of a rotational interferometer is comprised of a solid glass interferometer prism configuration incorporating symmetric use of lossless amplitude or polarization sensitive beamsplitters and symmetric out-of-plane reflections from plane mirror surfaces.

FIGS. 6A–C, 7A–D, and 8A–C illustrate three interferometric configurations, although others are possible. The designs illustrated in FIGS. 6A–C and 7A–C contain a particularly useful three mirror geometry in the form of a totally reflecting prism. There are two mirror surfaces symmetrically placed about a center base mirror. An image incident into the assembly on one side exits the second side rotated counterclockwise, that is rotated plus ninety degrees. An image incident into the assembly on the second side exits the first side rotated clockwise, that is rotated minus ninety degrees, so that the two images are rotated the desired one-hundred and eighty degrees with respect to each other. The image rotations can be interpreted as three-dimensional coordinate system rotations. The image manipulation and interferometric techniques may be assembled from combinations of other equivalent optical elements, such as gratings, Koster's prisms, lossy beamsplitters, both spherical and cylindrical lenses, as well as incorporating the reflections from folded mirror geometries such as comer cubes and ninety degree roof prisms among others. A practical embodiment may be the use of solid glass Michaelson interferometer-based configurations with folded mirror systems, in the form of prisms with internally reflecting bare or coated surfaces, replacing the usual air spaced flat mirrors. Two other options may be either one corner cube mirror assembly and a flat mirror or two ninety-degree roof prisms oriented with their vertices at right angles. However, such assemblies present fabrication difficulties and can return some light back toward the alignment mark. Variations of the mentioned Michaelson type interferometers have been used in Fourier transform spectrometers to measure star light coherence. The present invention can be applied to mask pattern and aerial image position sensing, as well as non-lithographic applications.

Accordingly, it should be appreciated that the present invention greatly facilitates alignment and is particularly applicable to alignment used in lithographic operations in the manufacture of semiconductor devices. The alignment sensor of the present invention makes available a large number of different alignment mark patterns and is self-referencing to the center of symmetry of the alignment marks. Accordingly, although the preferred embodiment has been illustrated and described, it will be obvious to those skilled in the art that various modifications may be made without departing from the spirit and scope of this invention.

What is claimed is:

1. An alignment sensor, comprises:

means for generating interferometric first and second images of a symmetrical alignment mark having a center, the first and second images being rotated with respect to each other;

a first means for detecting the first image from the means for generating; and a second means for detecting the second image from the means for generating;

means for analyzing output signals from the first and second means for detecting to determine a location of the center of the alignment mark.

2. The alignment sensor of claim 1, further comprising:

an illumination source having at least three different wavelengths, said illumination source providing coherent illumination to the alignment mark.

3. The alignment sensor of claim 1, further comprising:

an illumination source providing spatially coherent collimated electromagnetic radiation with a wavefront perpendicular to the alignment axis of the alignment sensor to the alignment mark.

4. The alignment sensor of claim 1, wherein:

said image rotation interferometer comprises glass prisms.

5. The alignment sensor of claim 4, wherein:

the glass prisms comprises two prisms joined at a beam-splitter surface.

6. The alignment sensor of claim 1, wherein:

said image rotation interferometer provides amplitude interference.

7. The alignment sensor of claim 1, wherein:

said image rotation interferometer provides polarization state interference.

* * * * *